(12) United States Patent
Tanaka

(10) Patent No.: US 7,411,229 B2
(45) Date of Patent: Aug. 12, 2008

(54) SEMICONDUCTOR DEVICE, A MANUFACTURING METHOD THEREOF, AND A CAMERA

(75) Inventor: Hiroshi Tanaka, Mukou (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/407,270

(22) Filed: Apr. 20, 2006

(65) Prior Publication Data
US 2006/0186439 A1    Aug. 24, 2006

Related U.S. Application Data

(62) Division of application No. 10/930,824, filed on Sep. 1, 2004, now Pat. No. 7,061,030.

(30) Foreign Application Priority Data
Sep. 4, 2003    (JP) ............... 2003-312253

(51) Int. Cl.
*H01L 27/148* (2006.01)
(52) U.S. Cl. ............. 257/222; 257/233; 257/E27.133
(58) Field of Classification Search ............. 257/215, 257/222, 233, 234, E27.083, E29.229, E27.133, 257/E29.133
See application file for complete search history.

(56) References Cited

U.S. PATENT DOCUMENTS

| | | | |
|---|---|---|---|
| 4,227,202 A * | 10/1980 | Tasch et al. ............... | 257/221 |
| 4,700,459 A * | 10/1987 | Peek ............................ | 438/587 |
| 5,393,690 A | 2/1995 | Fu et al. | |
| 5,483,090 A | 1/1996 | Kitamura et al. | |
| 5,723,884 A * | 3/1998 | Kim ........................... | 257/232 |
| 5,777,355 A * | 7/1998 | Possin et al. ................ | 257/233 |
| 6,023,081 A | 2/2000 | Drowley et al. | |
| 6,221,686 B1 | 4/2001 | Drowley et al. | |
| 6,236,074 B1 * | 5/2001 | Choi .......................... | 257/215 |
| 6,362,019 B1 | 3/2002 | Kuriyama | |
| 6,414,343 B1 | 7/2002 | Kondo et al. | |
| 6,521,920 B2 | 2/2003 | Abe | |
| 6,593,175 B2 | 7/2003 | Feudel et al. | |
| 6,690,423 B1 * | 2/2004 | Nakamura et al. ......... | 348/311 |

FOREIGN PATENT DOCUMENTS

| | | |
|---|---|---|
| JP | 5-206436 | 8/1993 |
| JP | 5-343440 | 12/1993 |
| JP | 6-085231 | 3/1994 |
| JP | 6-089995 | 3/1994 |
| JP | 6-151804 | 5/1994 |

* cited by examiner

*Primary Examiner*—Tuan N. Quach
(74) *Attorney, Agent, or Firm*—Wenderoth, Lind & Ponack, L.L.P.

(57) ABSTRACT

A semiconductor device includes a transfer channel for transferring charge generated by photoelectric conversion, an insulating film formed on the transfer channel, and a transfer electrode for applying a transfer voltage to the transfer channel via the insulating film. The insulating film has a first thickness and a second thickness that is thinner than the first thickness. The insulating film has the first thickness below both ends of the transfer electrode in a width direction of the transfer channel that is orthogonal to a charge transfer direction through the transfer channel, and the insulating film has the second thickness on a part including a center of the transfer channel in the width direction.

10 Claims, 14 Drawing Sheets

(a)

(b)

Ion implantation (c)

(d)

SEMICONDUCTOR DEVICE, A MANUFACTURING METHOD THEREOF, AND A CAMERA

This application is a divisional application of application Ser. No. 10/930,824, filed Sep. 1, 2004, now U.S. Pat. No. 7,061,030.

BACKGROUND OF THE INVENTION (1) Field of the Invention

The present invention relates to a semiconductor device including: a transfer channel for transferring charge generated by photoelectric conversion; an insulating film which is formed on the transfer channel; and a transfer electrode for applying a voltage for charge transfer to the transfer channel via the insulating film, a manufacturing method of the semiconductor device, and a camera, and particularly to improvements of the insulating film.

(2) Description of the Related Art

A CCD (Charge Coupled Device) solid-state image sensor is a kind of a semiconductor device. A CCD solid-state image sensor includes a matrix of photoelectric conversion elements (also referred to as "photodiodes"), a plurality of vertical CCDs that are shift registers for reading out charge from photodiodes row by row and transferring them in the vertical direction, and a horizontal CCD that is a shift register for transferring, in the horizontal direction, the charge transferred from the plurality of vertical CCDs. Each of the vertical CCDs and the horizontal CCD includes a transfer channel that is a charge transfer channel, two-layer transfer electrodes for applying a voltage to the transfer channel, and an insulating film between the transfer channel and the transfer electrode. In general, four-phase voltages are applied to the transfer electrodes of the vertical CCD, and two-phase voltages are applied to the transfer electrodes of the horizontal CCD.

FIG. 1 is a cross-sectional view of a conventional CCD solid-state image sensor. FIG. 2 is a top view of a CCD solid-state image sensor. Particularly, FIG. 1 shows a cross section X-X on the top view in FIG. 2 showing the transfer electrodes of the CCD solid-state image sensor.

In FIG. 2, a transfer channel 2 and transfer electrodes 5 and 6 which are alternately formed thereon construct a vertical CCD. The transfer electrode 5 doubles as a readout electrode for reading out charge from a photodiode 9 to the transfer channel 2. When a readout voltage is applied to the transfer electrode 5, it reads out the charge stored in the photodiode 9 to the transfer channel 2. The charge read out to the transfer channel 2 is shifted in sequence by the four-phase voltages applied to the transfer electrodes.

In FIG. 1, the transfer channel 2 is formed by doping an n-type dopant into a p-type well 1, for example. Above the transfer channel 2, the transfer electrode 5 is formed on the insulating film 3. The insulating film 3 is made up of two layers of a silicon oxide film and a silicon nitride film. Above the transfer electrode 5, a light-shielding film 8 is formed on the protective film 7.

Japanese Laid-Open Patent Application Publication No. 05-343440 discloses an invention regarding an improvement of a shape of a transfer electrode in a conventional solid-state image sensor.

However, the above conventional art has a problem that makes it difficult to reduce the thickness of an insulating film without degradation in image quality.

To be more specific, it is preferable that the insulating film between a transfer channel and a transfer electrode is thinner for greater amount of charge storage in the transfer channel or for complete readout of the charge from a photodiode to the transfer channel without the slightest loss in the charge.

However, the thinner insulating film causes the following adverse effects. The thinner insulating film causes an increase in electric field strength between the transfer electrode and the semiconductor substrate, thus producing hot electrons that cause noises in images, and as a result, image quality is degraded. In addition, trapping of these hot electrons in the insulating film induces a threshold shift of both the voltages for charge transfer and readout. Once the threshold shift occurs, the charge is not completely transferred within the transfer channel even if the normal transfer voltage is applied, and the charge is not completely read out to the transfer channel even if the normal readout voltage is applied. As a result, the image quality is degraded as if the sensitivity of the entire image is degraded.

Furthermore, with a recent advance of fine processing technology, it has been much more likely to produce the above-mentioned adverse effects on the insulating film resulted from the increase in the electric field strength.

SUMMARY OF THE INVENTION

The object of the present invention is to provide a semiconductor device for facilitating complete transfer and complete readout of charge, a manufacturing method thereof, and a camera.

In order to solve the above problem, the semiconductor device of the present invention is a semiconductor device comprising a transfer channel for transferring charge generated by photoelectric conversion, an insulating film formed on the transfer channel, and a transfer electrode for applying a transfer voltage to the transfer channel via the insulating film, wherein the insulating film has a first thickness and a second thickness, the second thickness being thinner than the first thickness, the insulating film has the first thickness below both ends of the transfer electrode in a width direction of the transfer channel, the width direction being orthogonal to a charge transfer direction through the transfer channel, the insulating film has the second thickness on a part including a center of the transfer channel in the width direction, and an undersurface of the transfer electrode has a downward convex shape in contact with the insulating film.

According to this structure, since the insulating film between the transfer channel and the transfer electrode has the second thickness at least on the part including the center of the transfer channel, there is an effect of storing a larger amount of charge in the transfer channel and facilitating complete readout of the charge generated by photoelectric conversion to the transfer channel. In addition, since the insulating film has the first thickness, that is thicker than the second thickness, below both ends of the transfer electrode, there occurs no increase in the electric field strength between the transfer electrode and the semiconductor substrate, and as a result, hot electrons are not generated. Therefore, the present invention has an effect that image quality is not degraded.

Here, a part with the second thickness of the insulating film may have a width the same as a width of the transfer channel in the width direction.

According to this structure, since a mask for forming the transfer channel can double as a mask for forming the second thickness part, the accuracy for alignment and registration can be improved. As a result, fine processing can be performed easily.

Here, the insulating film may include a silicon oxide film and a silicon nitride film.

According to this structure, the second thickness part can be formed by reducing the thickness of a part of the silicon nitride film without re-oxidization. Therefore, the present invention has an effect that no bird's beak is generated on the insulating film.

A part with the second thickness of the insulating film may have a width that is wider than a width of the transfer channel and narrower than a width of the transfer electrode in the width direction.

Here, the insulating film may include a silicon oxide film.

According to this structure, the second thickness part can be formed by reducing the thickness of a part of the silicon oxide film. Therefore, the present invention has an effect that there is little impact of birds' beaks even if they are generated due to re-oxidization after removing the part of the silicon oxide film that corresponds to the second thickness part.

Here, the transfer electrode may be an electrode to which a readout voltage is applied, the readout voltage being a voltage for reading out the charge generated by photoelectric conversion to the transfer channel.

The semiconductor device manufacturing method according to the present invention is a method for manufacturing a semiconductor device including a transfer channel for transferring charge generated by photoelectric conversion, an insulating film formed on the transfer channel, and a transfer electrode for applying a transfer voltage to the transfer channel via the insulating film, the method comprising: an insulating film forming step of forming a flat insulating film on a semiconductor substrate; a thickness reducing step of reducing a thickness of a predetermined part of the insulating film on a part including a center of the transfer channel in a width direction of the transfer channel, the width direction being orthogonal to a charge transfer direction through the transfer channel; and an electrode forming step of forming the transfer electrode on a part including the predetermined part of the insulating film.

According to this structure, since the thickness of the insulating film between the transfer channel and the transfer electrode is reduced at least on the part including the center of the transfer channel, there is an effect of storing a larger amount of charge in the transfer channel and facilitating complete readout of the charge generated by photoelectric conversion to the transfer channel. In addition, since the thickness of the insulating film is not reduced below both ends of the transfer electrode, there occurs no increase in the electric field strength between the transfer electrode and the semiconductor substrate, and as a result, hot electrons are not generated. Therefore, the present invention has an effect that image quality is not degraded.

Here, the predetermined part may be a part on the transfer channel and have a width the same as a width of the transfer channel in the width direction.

According to this structure, since a mask for forming the transfer channel can double as a mask for reducing the thickness in the thickness reducing step, the accuracy for alignment and registration can be raised. As a result, fine processing can be performed easily.

Here, the predetermined part may be a part on the transfer channel and have a width that is wider than the width of the transfer channel and narrower than a width of the transfer electrode in the width direction.

Here, the insulating film is a silicon oxide film, and in the thickness reducing step, the predetermined part of the insulating film may be removed once and the insulating film may be formed on the removed part so that the removed part becomes thinner than the other part.

According to this structure, the thinner part of the insulating film is wider than the width of the transfer channel. Therefore, the present invention has an effect that there is little impact of birds' beaks even if they are generated when the silicon oxide film is formed by re-oxidizing silicon after removing the part of the film.

Here, the insulating film is a silicon oxide film, and in the thickness reducing step, the thickness of the predetermined part of the insulating film may be reduced by half-etching.

Here, in the thickness reducing step, a silicon nitride film may be formed on the silicon oxide film in which the thickness of the predetermined part is reduced by half-etching.

Here, the insulating film may include two layers that are a silicon oxide film and a silicon nitride film, and the thickness reducing step may include: a removing substep of removing once a part of the silicon nitride film that corresponds to the predetermined part of the insulating film; and a forming substep of forming the silicon nitride film on the removed part so that the removed part of the insulating film becomes thinner than the other part.

Also, the removing substep may include: a first substep of forming a silicon oxide film on the silicon nitride film; a second substep of removing a part of the silicon oxide film that corresponds to the predetermined part of the insulating film; and a third substep of removing the part of the silicon nitride film that corresponds to the predetermined part of the insulating film, using an unremoved part of the silicon oxide film as a mask.

According to this structure, the thickness of the insulating film is reduced without re-oxidization. Therefore, the present invention has an effect that no bird's beak is generated on the silicon oxide film.

Furthermore, a camera according to the present invention has the same components as mentioned above.

As described above, according to the present invention, since the insulating film between the transfer channel and the transfer electrode has the second thickness at least on the part including the center of the transfer channel, there is an effect of facilitating complete transfer of the charge through the transfer channel and facilitating complete readout of the charge generated by photoelectric conversion to the transfer channel.

In addition, since the insulating film has the first thickness that is thicker than the second thickness below both ends of the transfer electrode, there occurs no increase in the electric field strength between the transfer electrode and the semiconductor substrate, and as a result, hot electrons are not generated. Therefore, the present invention has an effect that image quality is not degraded.

As further information about technical background to this application, the disclosure of Japanese Patent Application No. 2003-312253 filed on Sep. 4, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate specific embodiments of the invention. In the drawings.

DESCRIPTION OF THE PREFERRED EMBODIMENTS

First Embodiment

Structure of Semiconductor Device

Figure 1:
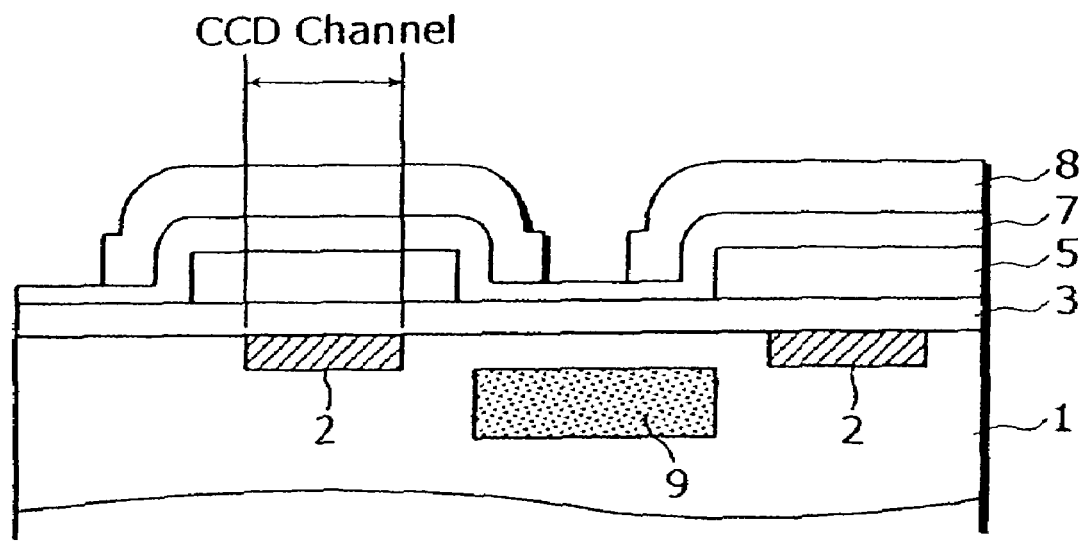
FIG. 1 is a cross-sectional view of a conventional CCD solid-state image sensor.
Figure 2:
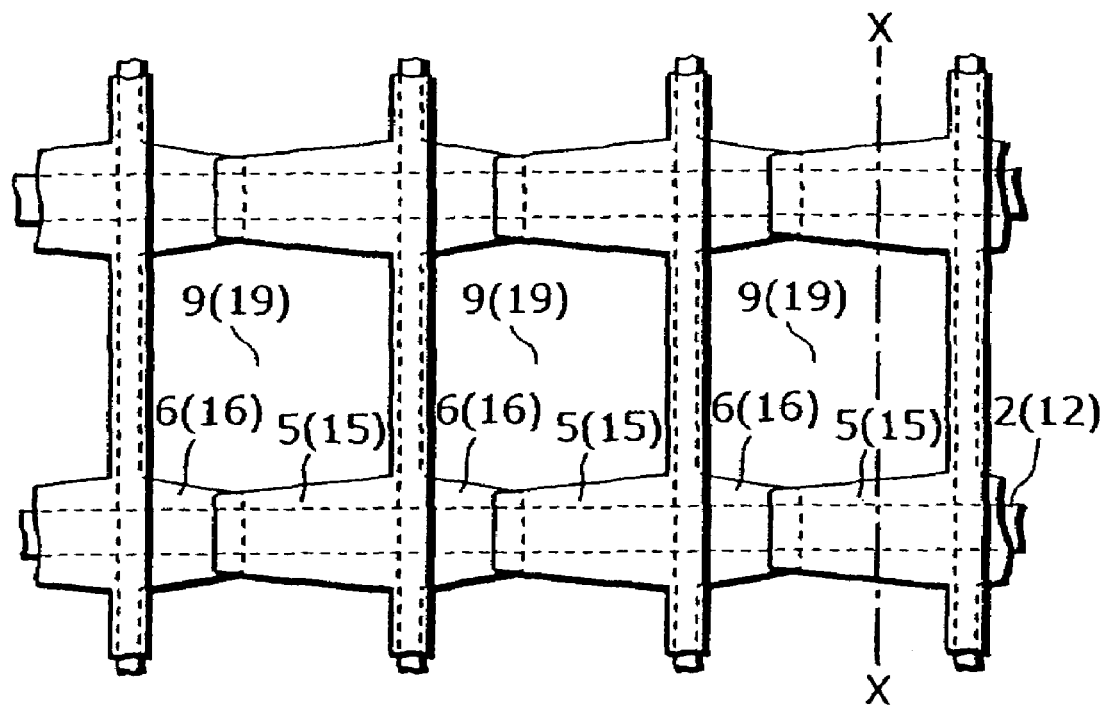
FIG. 2 is a top view showing transfer electrodes in a CCD solid-state image sensor.
Figure 3:
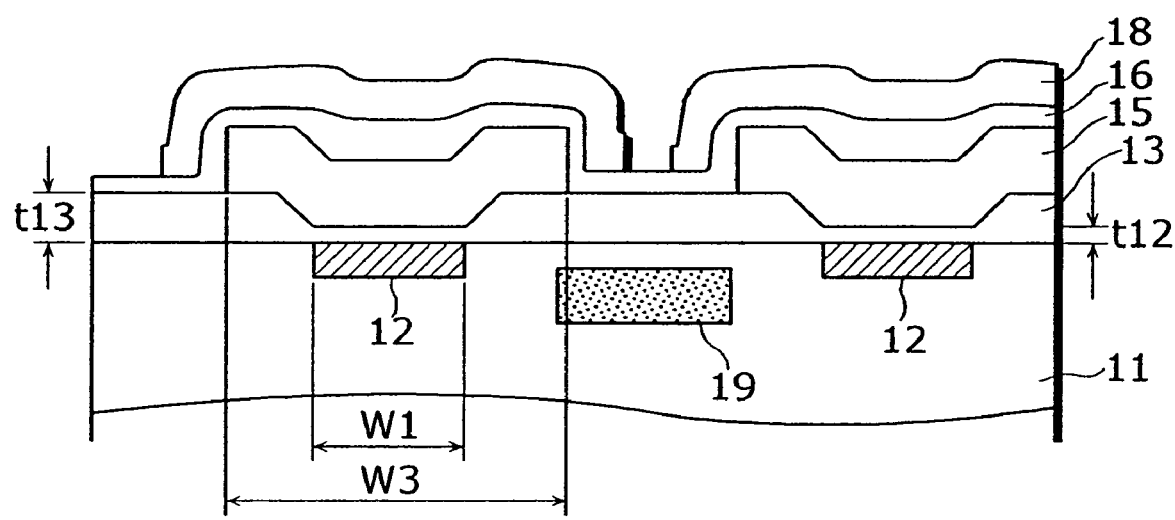
FIG. 3 is a diagram showing a cross section of a semiconductor device in a first embodiment of the present invention.

FIG. 3 is a diagram showing a cross section of a semiconductor device in a first embodiment of the present invention. FIG. 3 shows a cross section X-X on the top view in FIG. 2 showing the transfer electrodes of the CCD solid-state image sensor.

As shown in FIG. 3, the semiconductor device includes, in a silicon semiconductor substrate 11, a photodiode 19 (at a photoelectric conversion region) and a transfer channel 12 for transferring charge, and includes, on the silicon semiconductor substrate 11, an insulating film 13, a transfer electrode 15 for applying a transfer voltage to the transfer channel 12 through the insulating film 13, a protective film 16, and a light shielding film 18.

The photodiode 19 is a layer formed by doping an n-type dopant into the p-type silicon semiconductor substrate 11, for example. The transfer channel 12 is formed by doping an n-type dopant into the silicon semiconductor substrate 11, for example. The transfer electrode 15 is made up of polycrystalline silicon to which high concentration of phosphorus is doped, for example.

The insulating film 13 is made of silicon oxide with the first thickness t13 (30 to 50 nm) and the second thickness t12 (15 to 25 nm). The second thickness part of the insulating film 13 is placed on the transfer channel 12 in the direction (the horizontal direction in the diagram or the width direction of the transfer channel 12) orthogonal to the charge transfer direction (the vertical direction through the sheet) through the transfer channel 12, and has the same width as the width W1 of the transfer channel 12 in this diagram. This width W1 is the width of the transfer channel 12 in the direction (the width direction) orthogonal to the charge transfer direction. The other part of the insulating film 13 than the second thickness part has the first thickness.

The bottom of the transfer electrode 15 has a downward convex shape because it is formed in contact with the insulating film 13.

As mentioned above, the insulating film has the second thickness that is thinner than the first thickness in the part between the transfer channel 12 and the transfer electrode 15. Therefore, it is possible to facilitate an increase in an amount of charge stored in the transfer channel 12 and complete readout of charge which is generated by photoelectric conversion to the transfer channel 12. In addition, since the insulating film has the first thickness that is thicker than the second thickness below the ends of the transfer electrode, a strong electric field is not generated between the transfer electrode 15 and the silicon semiconductor substrate 11, and thus hot electrons are not produced.

Manufacturing Method of Semiconductor Device

It is possible to manufacture the semiconductor device as shown in FIG. 3 in various methods depending on manufacturing processes. The first through the third manufacturing methods will be explained.

First Manufacturing Method

Figure 4:
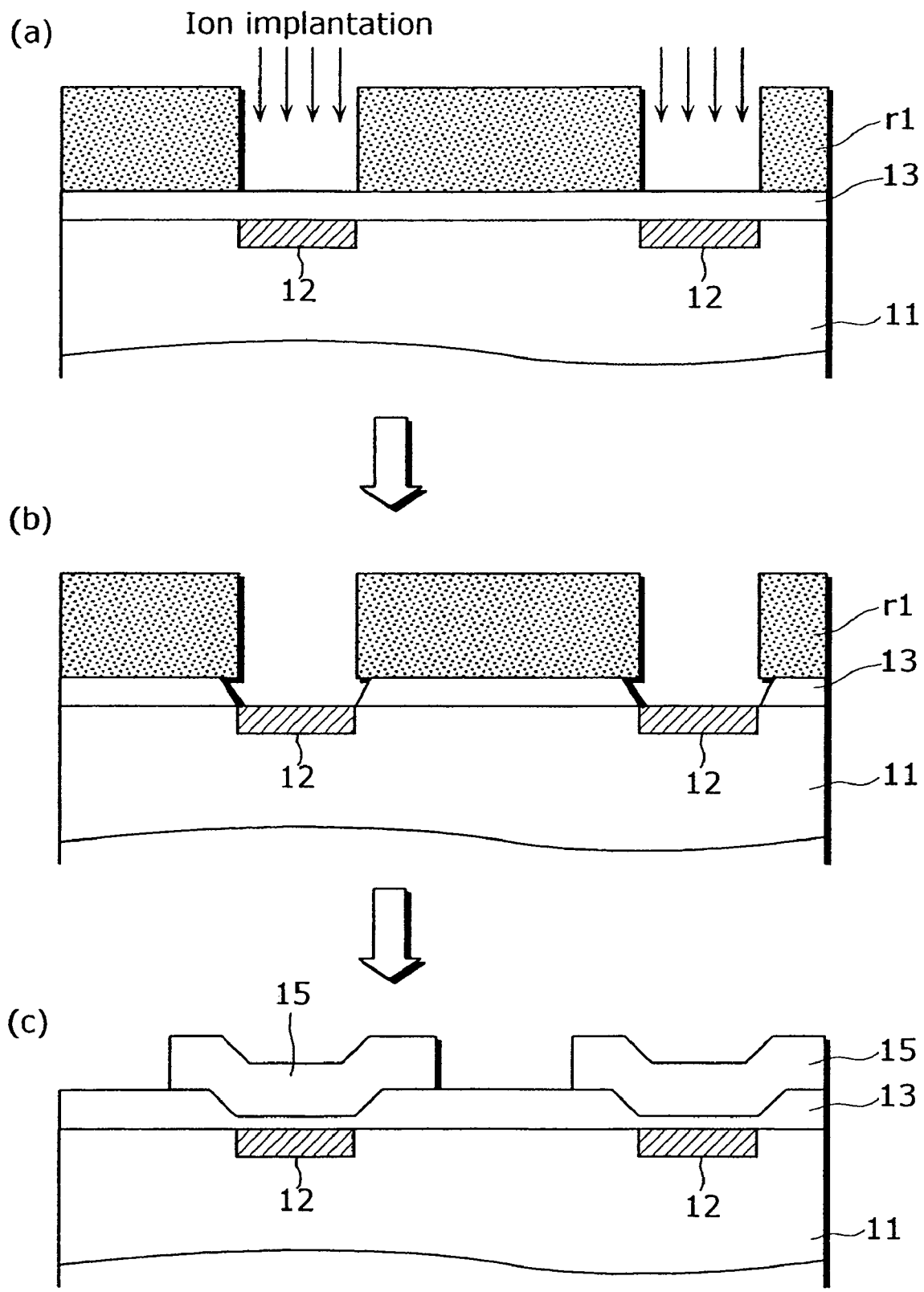
FIGS. 4(a)-4(c) are diagrams showing a first manufacturing method of the semiconductor device in the first embodiment.

FIGS. 4(a) to 4(c) are diagrams illustrating, in manufacturing process sequence of the first manufacturing method, cross sections of the semiconductor device in the first embodiment. Such manufacturing process shall be explained in (11) to (15) below.

(11) As shown in FIG. 4(a), by oxidizing the surface of the silicon semiconductor substrate 11 using the thermal oxidation method, a silicon oxide film (with the thickness of about 10 to 30 nm) is first formed, as the insulating film 13, on the substrate 11, so that the thickness of the film becomes thinner than the first thickness (about 30 to 50 nm). Next, a resist pattern r1 is formed on the insulating film 13 by applying a resist on the insulating film 13, exposing it using a mask pattern for forming the transfer channel 12, and developing it. Then, the transfer channel 12 is formed by doping an n-type dopant such as arsenic, using ion implantation, into the silicon semiconductor substrate 11 through the silicon oxide film 13.

(12) As shown in FIG. 4(b), the resist pattern r1 is left in place, while removing the silicon oxide film on the transfer channel 12 by etching. For example, by wet etching using hydrofluoric acid, the silicon oxide film on the part not masked with the resist pattern r1 is removed. In this etching, the mask pattern for forming the transfer channel 12 is used as the resist pattern r1, so the silicon oxide film only on the transfer channel 12 can be removed with pinpoint accuracy.

(13) As shown in FIG. 4(c), after removing the resist pattern r1, the silicon oxide film is formed, by oxidizing the entire surface using thermal oxidation, for example, over the film which has been masked with the resist pattern r1. As a result, the silicon oxide film has the first thickness (about 30 to 50 nm) in the part thereof where the resist pattern r1 has not been removed in the above (12), whereas the second thickness (about 10 to 30 nm) in the part thereof where the resist pattern r1 has been removed. As a result, the insulating film 13 has the second thickness part with the same width as that of the transfer channel 12, directly on the transfer channel 12.

(14) As shown in FIG. 4(c), after removing the resist pattern r1, the transfer electrode 15 is formed. This transfer electrode 15 is formed by so-called patterning. To be more specific, the transfer electrode is formed by forming polysilicon with conductivity, applying resist, and exposing and developing the surface using a mask pattern for forming the transfer electrode 15.

(15) After that, as shown in FIG. 3, the protective film 16 and the light shielding film 18 are formed. The semiconductor device as shown in FIG. 3 is manufactured in the above-mentioned process.

Second Manufacturing Method

Figure 5:
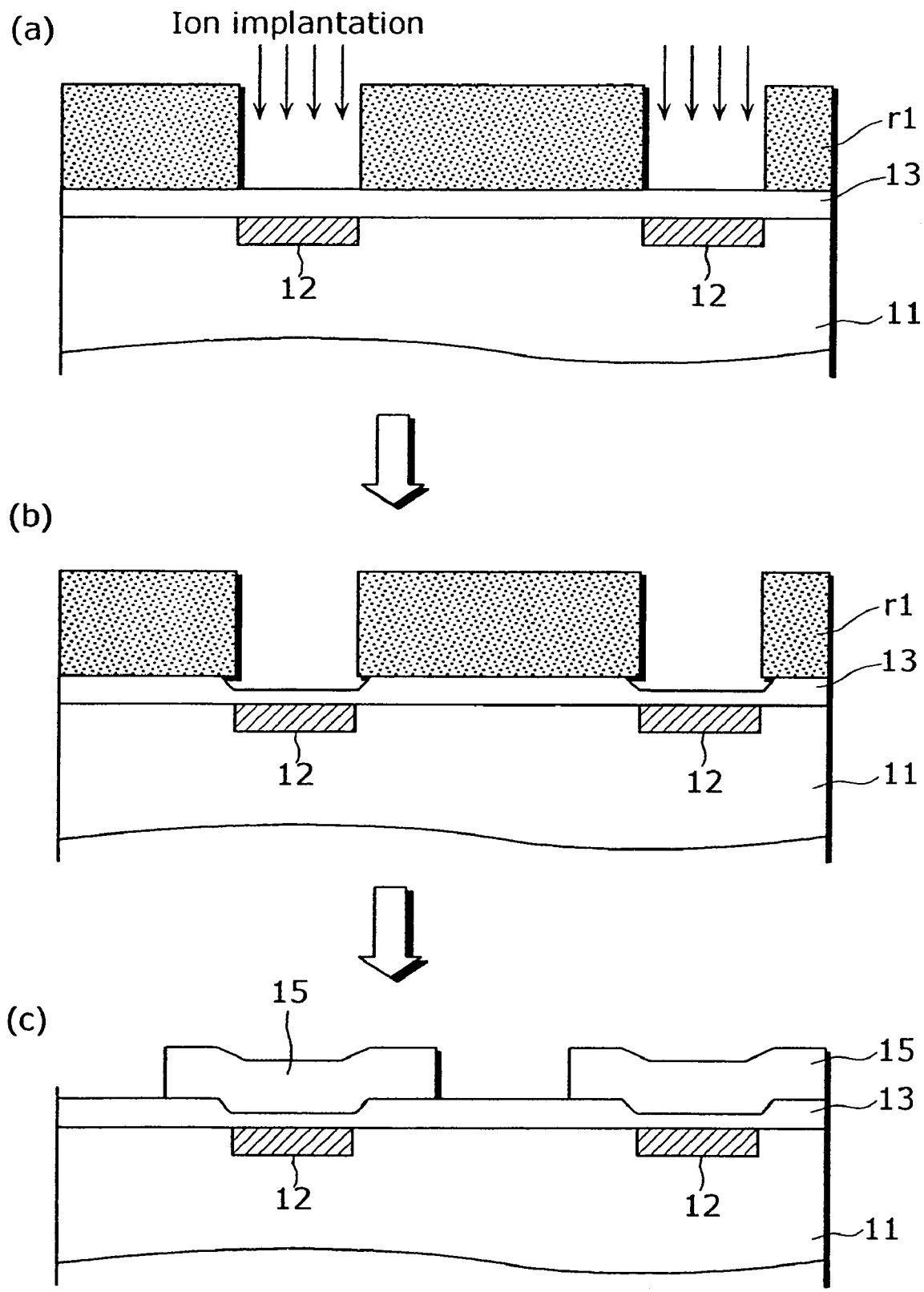
FIGS. 5(a)-5(c) are diagrams showing a second manufacturing method of the semiconductor device in the first embodiment.

FIGS. 5(a) to 5(c) are diagrams illustrating, in manufacturing process sequence of the second manufacturing method, cross sections of the semiconductor device in the first embodiment. Such manufacturing process shall be explained in (21) to (24) below.

(21) As shown in FIG. 5(a), the insulating film 13, the resist pattern r1 and the transfer channel 12 are formed. In this process, the insulating film 13 is formed so as to have the first thickness (about 30 to 50 nm). This process is same as the above (11) except for the thickness of the insulating film, so the explanation thereof is not repeated here.

(22) As shown in FIG. 5(b), the resist pattern r1 is left in place, while removing the silicon oxide film on the transfer channel 12 by half-etching. For example, by dry etching, the part of the silicon oxide film not masked with the resist pattern r1 is removed partway, namely, until the silicon oxide film with the second thickness (about 10 to 30 nm) is left. In this etching, the mask pattern for forming the transfer channel 12 is used as the resist pattern r1, so the silicon oxide film only on the transfer channel 12 can be removed with pinpoint accuracy.

(23) As shown in FIG. 5(c), the transfer electrode 15 is formed. Since the details of this process are the same as the above (14), the explanation thereof is not repeated here.

(24) After that, as shown in FIG. 3, the protective film 16 and the light shielding film 18 are formed. The semiconductor device as shown in FIG. 3 is manufactured in the above-mentioned process.

The above-mentioned second manufacturing method has an advantage over the first manufacturing method in that birds' beaks are not generated on the insulating film 13 (silicon oxide film), but has a disadvantage in the accuracy of the second thickness. To be more specific, the birds' beaks are generated on the ends of the second thickness part in the above process (13) of thermal oxidation for forming the insulating film with the second thickness, whereas they are not generated in the second manufacturing method. In addition, the second thickness is determined according to the time duration of etching in the half-etching mentioned above in (22), which can possibly result in a wider range of variations in the thickness than those in the above process (13).

Third Manufacturing Method

FIGS. 6(a) to 6(d) are diagrams illustrating, in manufacturing process sequence of the third manufacturing method, cross sections of the semiconductor device in the first embodiment. Such manufacturing process shall be explained in (31) to (35) below. The third manufacturing method is different from the first manufacturing method in that the transfer channel 12 is formed in the following process (33), not in the above (11).

Figure 6:
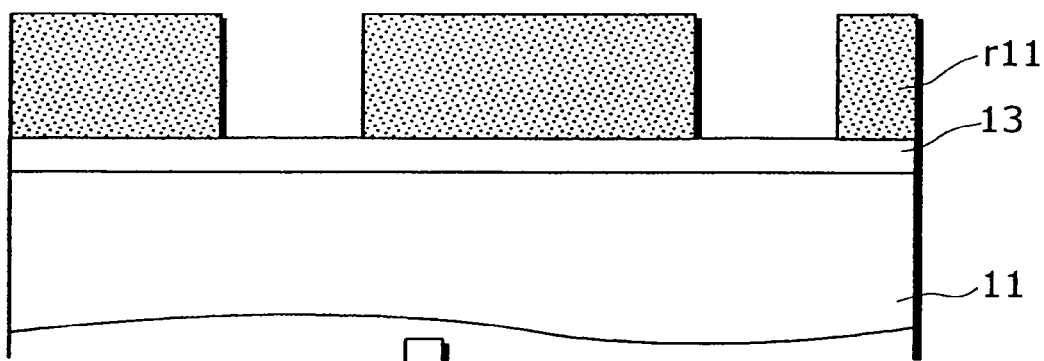
FIGS. 6(a)-6(d) are diagrams showing a third manufacturing method of the semiconductor device in the first embodiment.
Figure 6:
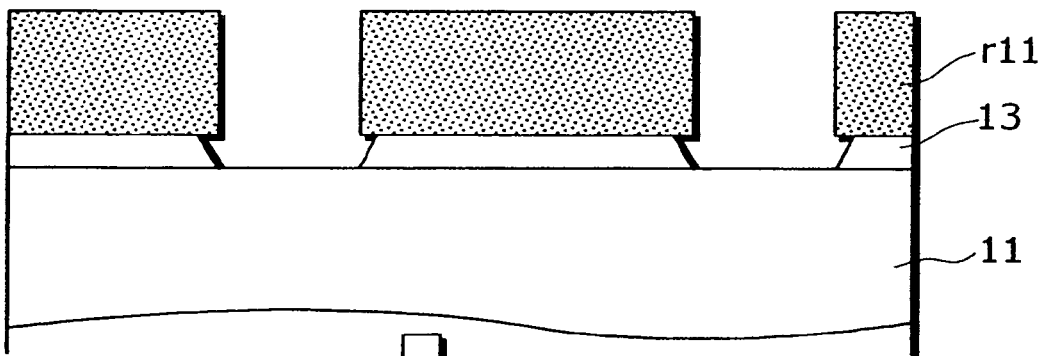
Figure 6:
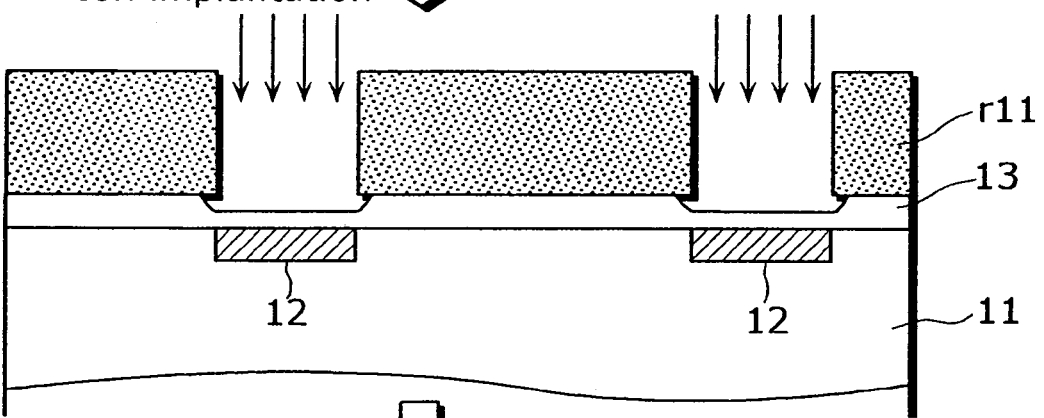
Figure 6:
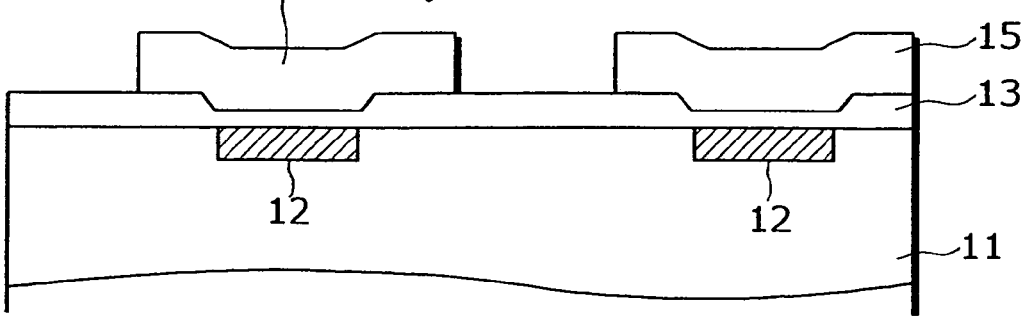

(31) As shown in FIG. 6(a), the insulating film 13 and the resist pattern r11 are formed. This process is same as the above (11) except that the transfer channel 12 is not formed, the resist pattern ril is made of silicon nitride, and the insulating film 13 has the first thickness (about 30 to 50 nm), so the explanation thereof is not repeated here.

(32) As shown in FIG. 6(b), the resist pattern r1 is left in place, while removing, by etching, a part of the silicon oxide film on the area where the transfer channel 12 is to be formed. Since this process is same as the above (12), the explanation thereof is not repeated here.

(33) As shown in FIG. 6(c), the resist pattern r1 is left in place, while forming, by oxidizing the entire surface using the thermal oxidation method, the part of the silicon oxide film on the area where the transfer channel 12 is to be formed, so that the silicon oxide film has the second thickness (about 10 to 30 nm). As a result, the insulating film 13 has the second thickness part with the same width as that of the transfer channel 12 on the area where the transfer channel 12 is to be formed. Next, the transfer channel 12 is formed by doping an n-type dopant such as arsenic, using ion implantation, into the silicon semiconductor substrate 11 through the silicon oxide film 13. The surface of the silicon nitride film as the resist pattern r11 is also oxidized by the above thermal oxidation method, but it is possible to remove the resist pattern r11 easily by removing the silicon oxide on the silicon nitride surface using phosphoric acid, for example.

(34) As shown in FIG. 6(d), after removing the resist pattern r11, the transfer electrode 15 is formed. Since this process is same as the above (14), the explanation thereof is not repeated here.

(35) After that, as shown in FIG. 3, the protective film 16 and the light shielding film 18 are formed. The semiconductor device as shown in FIG. 3 is manufactured in the above-mentioned process.

It is possible to manufacture the semiconductor device using silicon nitride as a resist pattern, as mentioned above.

It should be noted that, in the second manufacturing method, the transfer channel 12 may be formed after making a part of the insulating film thinner (i.e., forming the second thickness thereof), not before it.

Figure 7:
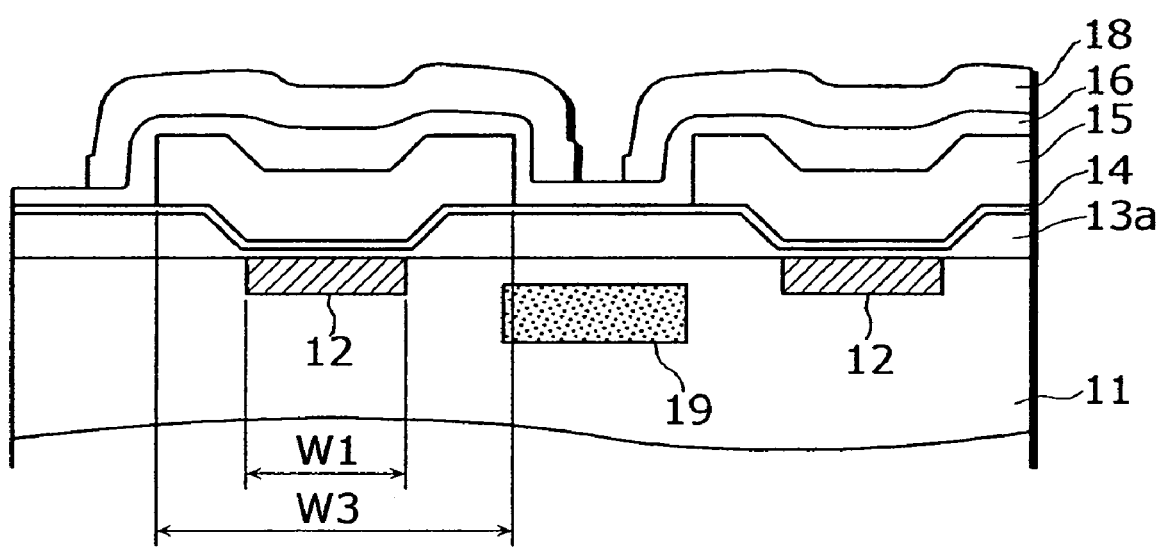
FIG. 7 is a diagram showing a cross section of a semiconductor device including a two-layer insulating film.

FIG. 3 shows an example where the insulating film 13 is made of silicon oxide, but it is also possible to form a two-layer insulating film including a silicon oxide film and a silicon nitride film. FIG. 7 shows a cross section of a semiconductor device including a two-layer insulating film. FIG. 7 is different from FIG. 3 in that the insulating film has two layers, a silicon oxide film 13a and a silicon nitride film 14. In order to form this two-layer insulating film, the process of removing a resist pattern and forming a silicon nitride film on a silicon oxide film is added after making the silicon oxide insulating film thinner (in the above process (13), (22) or (33)) in the first, second or third manufacturing method. This silicon nitride film is formed by the low pressure CVD (Chemical Vapor Deposition) method, for example. In the case where the insulating film has two layers, respective layers are formed so that the total thickness thereof has the first thickness and the second thickness. As a result, the semiconductor device as shown in FIG. 7 can be manufactured.

Second Embodiment

Structure of Semiconductor Device

Figure 8:
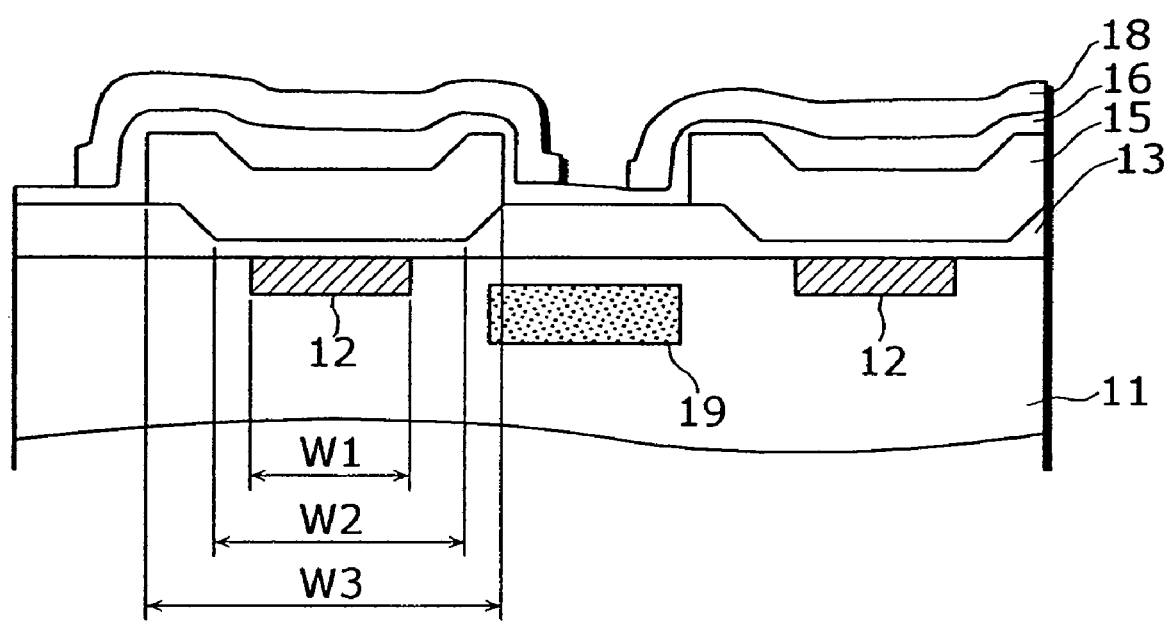
FIG. 8 is a diagram showing a cross section of a semiconductor device in a second embodiment of the present invention.

FIG. 8 is a diagram showing a cross section of a semiconductor device in the second embodiment of the present invention. FIG. 8 shows a cross section X-X on the top view in FIG. 2 showing the transfer electrodes of the CCD solid-state image sensor. The semiconductor device in FIG. 8 is different from that in FIG. 3 in that the former has the insulating film 13 including the second thickness part with W2 width, whereas the latter has the insulating film 13 including the second thickness part with W1 width. In the following explanation, different points are focused on, and the explanation of the same points is not repeated here.

The width W2 of the second thickness part of the insulating film 13 is wider than the width W1 of the transfer channel 12 and narrower than the width W3 of the transfer electrode 15. These widths W1 and W3 are respectively the widths of the transfer channel 12 and the transfer electrode 15 in the direction orthogonal to the charge transfer direction.

According to this structure, even if birds' beaks are generated in the second thickness part of the insulating film 13, it is possible to minimize the adverse effect produced around the edges between the insulating film and the W2-wide transfer electrode 15. In other words, it is possible to minimize an occurrence of a dark current due to hot electrons.

Manufacturing Method of Semiconductor Device

It is possible to manufacture the semiconductor device as shown in FIG. 8 in various methods depending on manufacturing processes. The first and the second manufacturing methods will be explained.

First Manufacturing Method

FIGS. 9(a) to 9(d) are diagrams illustrating, in manufacturing process sequence of the first manufacturing method, cross sections of the semiconductor device in the second embodiment. Such manufacturing process shall be explained in (41) to (45) below.

Figure 9:
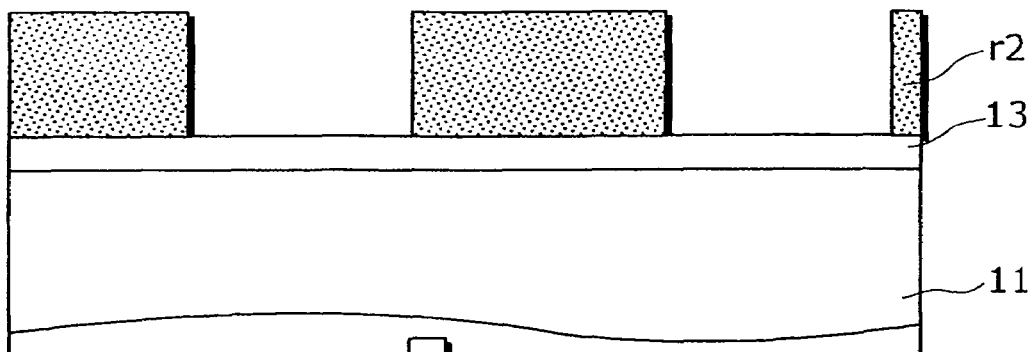
FIGS. 9(a)-9(d) are diagrams showing a first manufacturing method of the semiconductor device in the second embodiment.
Figure 9:
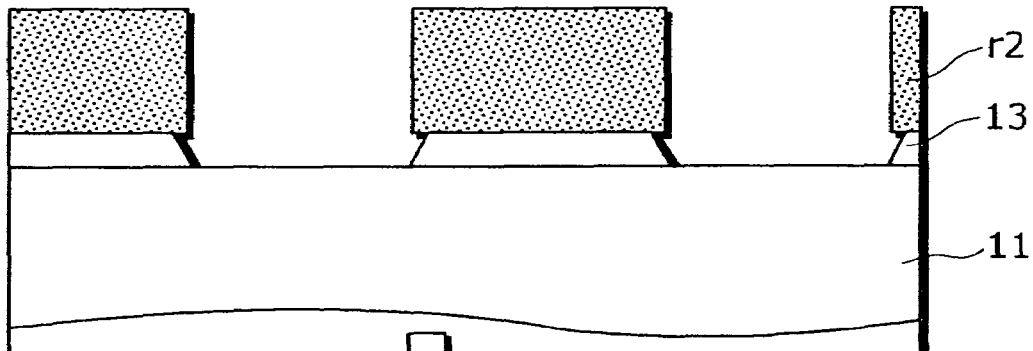
Figure 9:
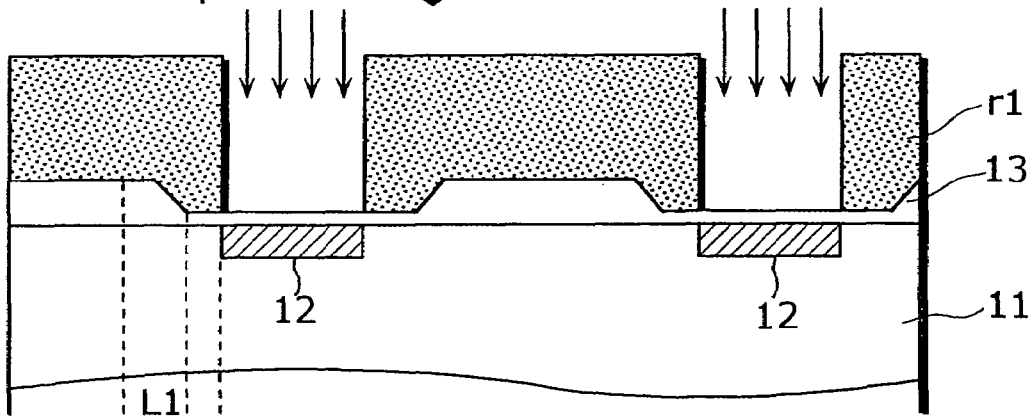
Figure 9:
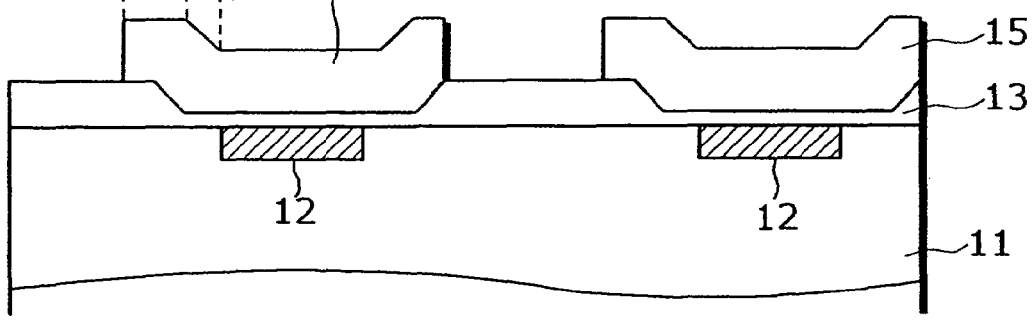

(41) As shown in FIG. 9(a), the insulating film 13 and the resist pattern r2 are formed. (41) is different from the above (11) in that this resist pattern r2 is formed using a mask pattern for forming the second thickness part of the insulating film 13 and the transfer channel 12 is not formed in this process (41). To be more specific, the resist pattern r2 is formed using a mask pattern exclusively for forming the second thickness part, not using a mask pattern for forming the transfer channel 12. The other points are the same as those in the above process (11).

(42) As shown in FIG. 9(b), the resist pattern r2 is left in place, while removing, by etching, the part of the silicon oxide film on the area where the transfer channel 12 is to be formed. The resist pattern r2 is removed, and then the silicon oxide film is formed by oxidizing the entire surface using the thermal oxidation method, for example, so that the first thickness part and the second thickness part are formed.

(43) As shown in FIG. 9(c), after removing the resist pattern r2, the resist pattern r1 is formed. This resist pattern r1 is formed using a mask pattern for forming the transfer channel. Then, under this condition, the transfer channel 12 is formed by doping an n-type dopant such as arsenic, using ion implantation, into the silicon semiconductor substrate 11 through the silicon oxide film 13.

(44) As shown in FIG. 9(d), after removing the resist pattern r1, the transfer electrode 15 is formed. Since this process is same as the above process (14), the explanation thereof is not repeated here.

(45) Then, as shown in FIG. 8, the protective film 16 and the light shielding film 18 are formed. The semiconductor device as shown in FIG. 8 is manufactured in the above-mentioned process.

Second Manufacturing Method

Figure 10:
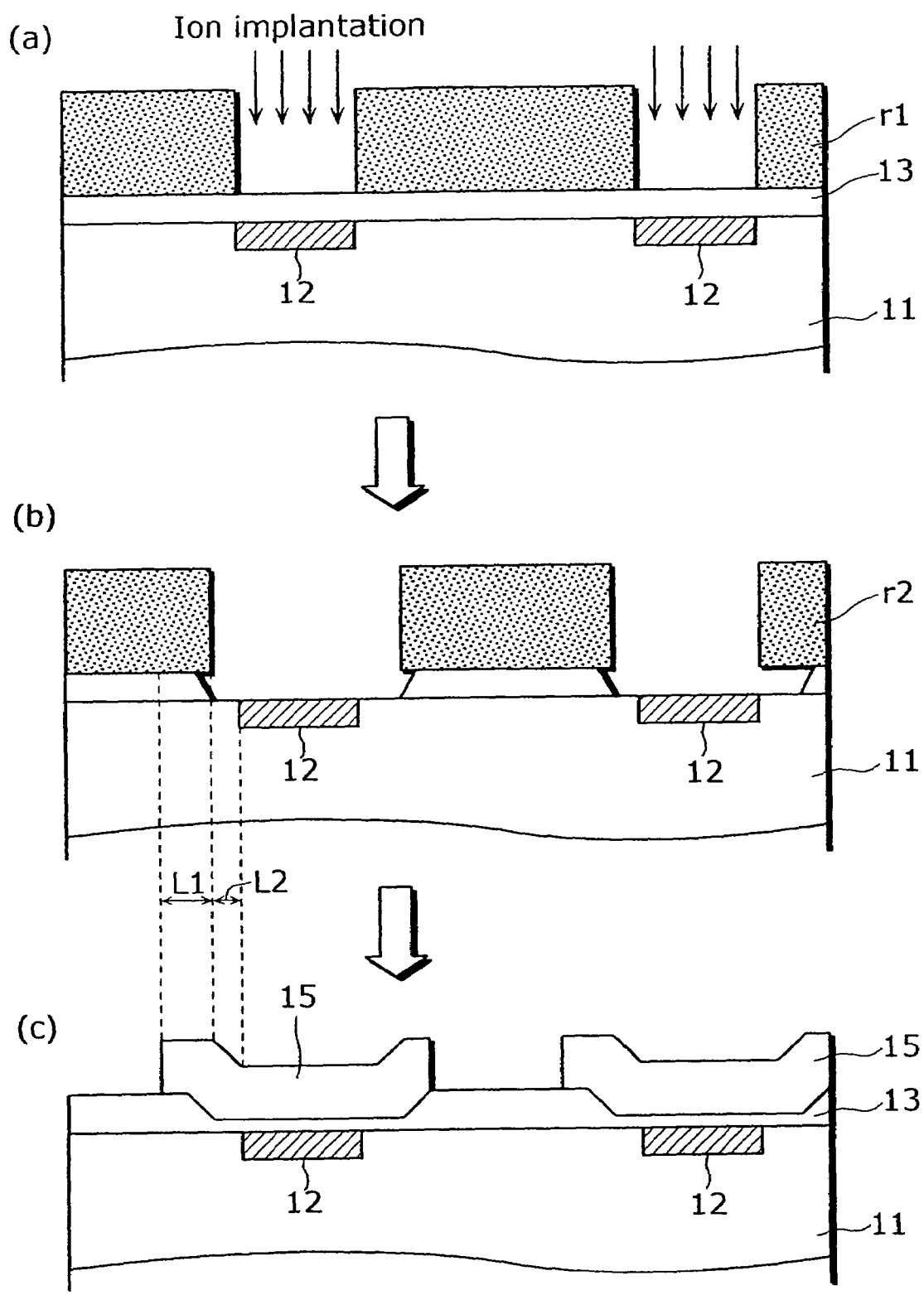
FIGS. 10(a)-10(c) are diagrams showing a second manufacturing method of the semiconductor device in the second embodiment.

FIGS. 10(a) to 10(c) are diagrams illustrating, in manufacturing process sequence of the second manufacturing method, cross sections of the semiconductor device in the second embodiment. The second manufacturing method as shown in FIGS. 10(a)-10(c) is different from the first manufacturing method as shown in FIGS. 9(a)-9(d) in the process sequence. The transfer channel 12 is formed after forming the thinner part (second thickness part) of the insulating film 13 in the first method, whereas the thinner part of the insulating film 13 is formed after forming the transfer channel 12 in the second method. Such manufacturing process shall be explained in (51) to (55) below.

(51) As shown in FIG. 10(a), the insulating film 13, the resist pattern r1 and the transfer channel 12 are formed. This process is same as the above (11), so the explanation thereof is not repeated here.

(52) As shown in FIG. 10(b), after removing the resist pattern r1 for forming the transfer channel 12, the resist pattern r2 for forming the second thickness part of the insulating film 13 is formed. Under this condition, the silicon oxide film on the transfer channel 12 is removed by etching.

(53) Then, after removing the resist pattern r2, the first and second thickness parts of the silicon oxide film are formed by oxidizing the entire surface. Therefore, the second thickness part with the same width as the width W2 of the removed part of the resist pattern r2 is formed. As a result, the width W2 of the second thickness part (W1+2L2) is larger than the width W1 of the transfer channel 12.

(54) As shown in FIG. 10(c), after removing the resist pattern r2, the transfer electrode 15 is formed. Since this process is same as the above (14), the explanation thereof is not repeated here. As a result, the width of the transfer electrode 15 (W2+2L1) is larger than the width W2 of the second thickness part.

(55) After that, as shown in FIG. 8, the protective film 16 and the light shielding film 18 are formed. The semiconductor device as shown in FIG. 8 is manufactured in the above-mentioned process.

Figure 11:
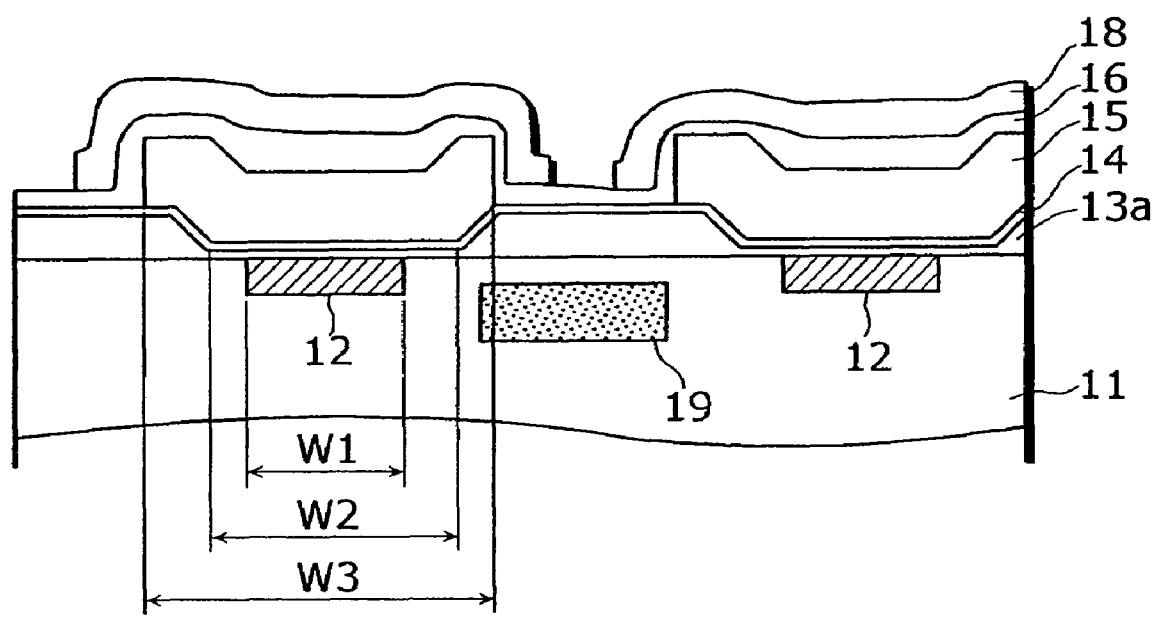
FIG. 11 is a diagram showing a cross section of a semiconductor device including a two-layer insulating film.

FIG. 8 shows an example where the insulating film 13 is made of silicon oxide, but it is also possible to form a two-layer insulating film (i.e., insulating portion) which is made of silicon oxide and silicon nitride. FIG. 11 shows a cross section of a semiconductor device including a two-layer insulating film. FIG. 11 is different from FIG. 8 in that the insulating film has two layers made of a silicon oxide film 13a and a silicon nitride film 14. In order to form this two-layer insulating film, the process of removing a resist pattern and forming a silicon nitride film on a silicon oxide film is added after making the silicon oxide insulating film thinner (above process (43) or (53)) in the first or second manufacturing method. This silicon nitride film is formed by the low pressure CVD method, for example. In the case where the insulating film has two layers, respective layers are formed so that the total thickness thereof has the first thickness and the second thickness. As a result, the semiconductor device as shown in FIG. 11 can be manufactured.

In addition, in the above first and second manufacturing methods (FIGS. 9(a)-9(d) and FIGS. 10(a)-10(c)), the silicon oxide film with the second thickness is formed by removing the silicon oxide on the transfer channel 12 once and then re-oxidizing it. Instead, the silicon oxide film with the second thickness may be formed by half-etching.

Third Embodiment

In the above first and second embodiments, the insulating film has the second thickness part by making the silicon oxide film thinner in both cases where the insulating film has one layer (made of silicon oxide) and two layers (made of silicon oxide and silicon nitride). On the other hand, in the present embodiment, the insulating film has the second thickness part by making the silicon nitride film thinner in the case where the insulating film has two layers.

Figure 12:
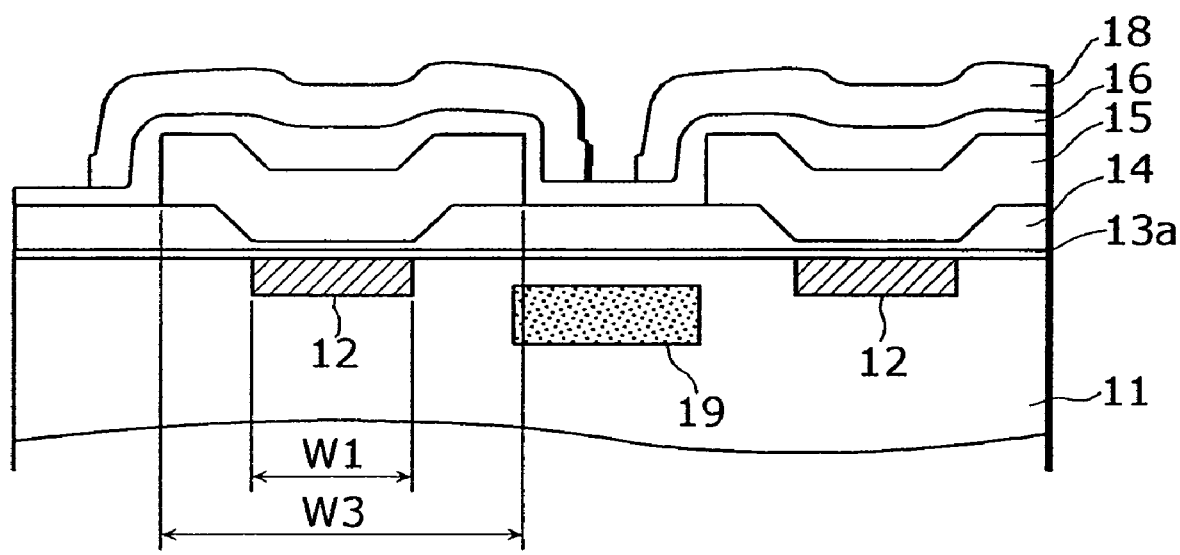
FIG. 12 is a diagram showing a cross section of a semiconductor device in a third embodiment of the present invention.

FIG. 12 is a diagram showing a cross section of a semiconductor device in the third embodiment of the present invention. FIG. 12 shows a cross section X-X on the top view in FIG. 2 showing the transfer electrodes of the CCD solid-state image sensor. The semiconductor device in FIG. 12 is different from that in FIG. 11 in that the thickness of the silicon oxide film 13a, out of the two layers of the insulating film, is flat, and that the thickness of the silicon nitride film 14 is not flat and has the thinner part. In other words, the difference between the first thickness and the second thickness of the insulating film is the difference in the thickness of the silicon nitride film 14, not of the silicon oxide film 13a.

According to this structure, the thickness of a part of the insulating film can be reduced without re-oxidizing the silicon oxide film 13a (see, for example, FIG. 4(c), FIG. 6(c), FIG. 9(c) and FIG. 10(c)), so there is an advantage that birds' beaks are not generated on the silicon oxide film, but requires an extra process of forming the two-layer insulating film.

Manufacturing Method of Semiconductor Device

It is possible to manufacture the semiconductor device as shown in FIG. 12 in various methods depending on manufacturing processes. The first through the third manufacturing methods will be explained.

First Manufacturing Method

Figure 13:
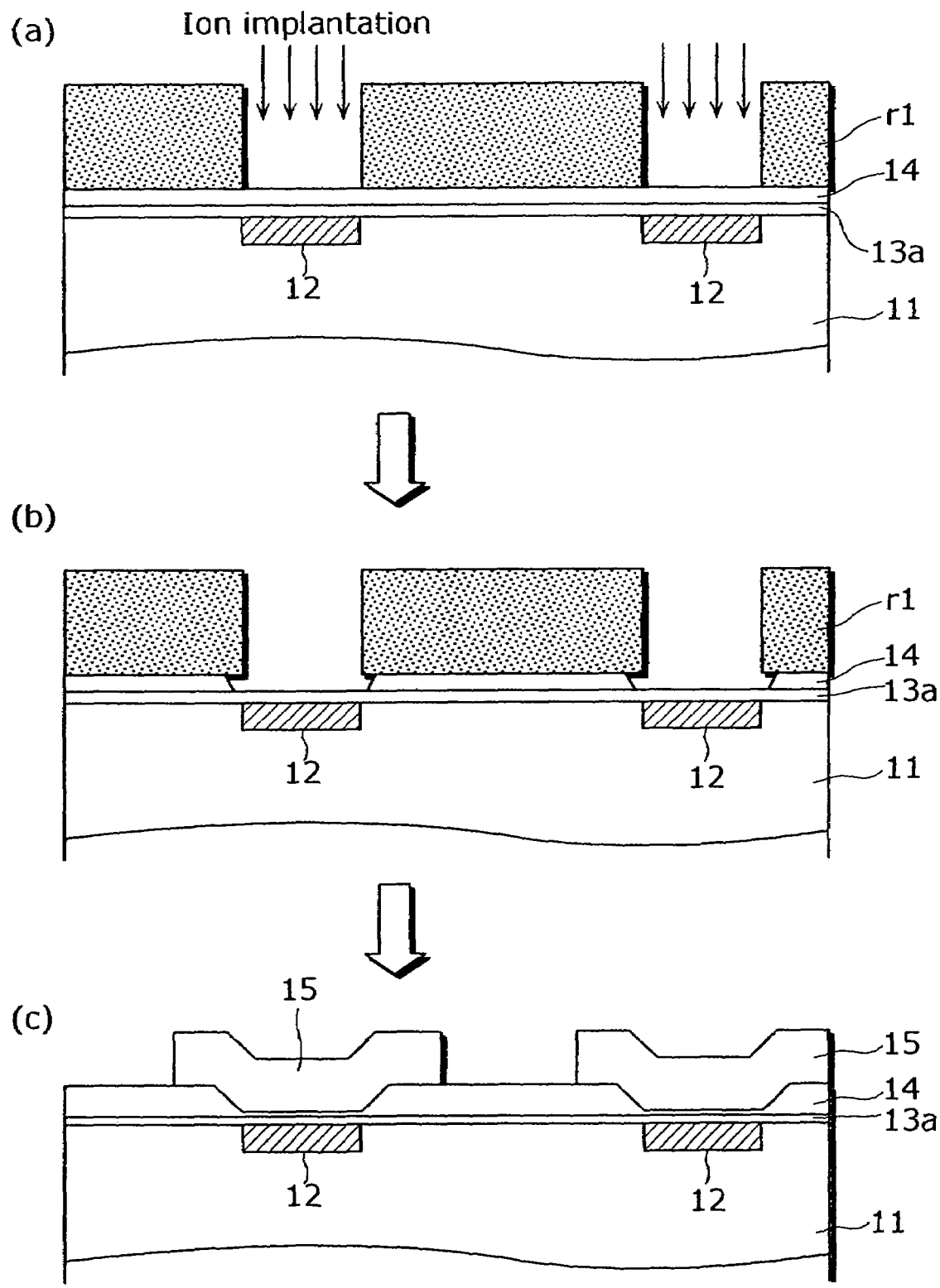
FIGS. 13(a)-13(c) are diagrams showing a first manufacturing method of the semiconductor device in the third embodiment.

FIGS. 13(a) to 13(c) are diagrams illustrating, in manufacturing process sequence of the first manufacturing method, cross sections of the semiconductor device in the third embodiment. Such manufacturing process shall be explained in (61) to (65) below.

(61) As shown in FIG. 13(a), the silicon oxide film 13a (with the thickness of about 10 nm) is formed by oxidizing the surface of the silicon semiconductor substrate 11 using the thermal oxidation method, for example, and the silicon nitride film 14 (with the thickness of about 20 to 40 nm) is formed on the silicon oxide film 13a by the low pressure CVD method. As a result, the flat insulating film with the first thickness is formed. Next, the resist pattern r1 is formed on the silicon nitride film. Furthermore, the transfer channel 12 is formed by doping an n-type dopant such as arsenic, using ion implantation, into the silicon semiconductor substrate 11 through the silicon oxide film 13a and the silicon nitride film 14.

(62) As shown in FIG. 13(b), the resist pattern r1 is left in place, while removing the silicon nitride film above the transfer channel 12 by etching. The part of the silicon nitride film not masked with the resist pattern r1 is removed. In this etching, the mask pattern for forming the transfer channel 12 is used as the resist pattern r1, so the silicon nitride film only above the transfer channel 12 can be removed with pinpoint accuracy.

(63) Then, after removing the resist pattern r1, the silicon nitride film (with the thickness of about 10 nm) is formed by nitriding the entire surface again. As a result, the two-layer insulating film 13 has the first thickness part and the second thickness part. In this manner, the second thickness part with the same width as that of the transfer channel 12 is formed on the transfer channel 12.

(64) As shown in FIG. 13(c), the transfer electrode 15 is formed.

(65) After that, as shown in FIG. 12, the protective film 16 and the light shielding film 18 are formed. The semiconductor device as shown in FIG. 12 is manufactured in the above-mentioned process.

Second Manufacturing Method

FIGS. 14(a) to 14(e) are diagrams illustrating, in manufacturing process sequence of the second manufacturing method, cross sections of the semiconductor device in the third embodiment. Such manufacturing process shall be explained in (71) to (75) below.

Figure 14:
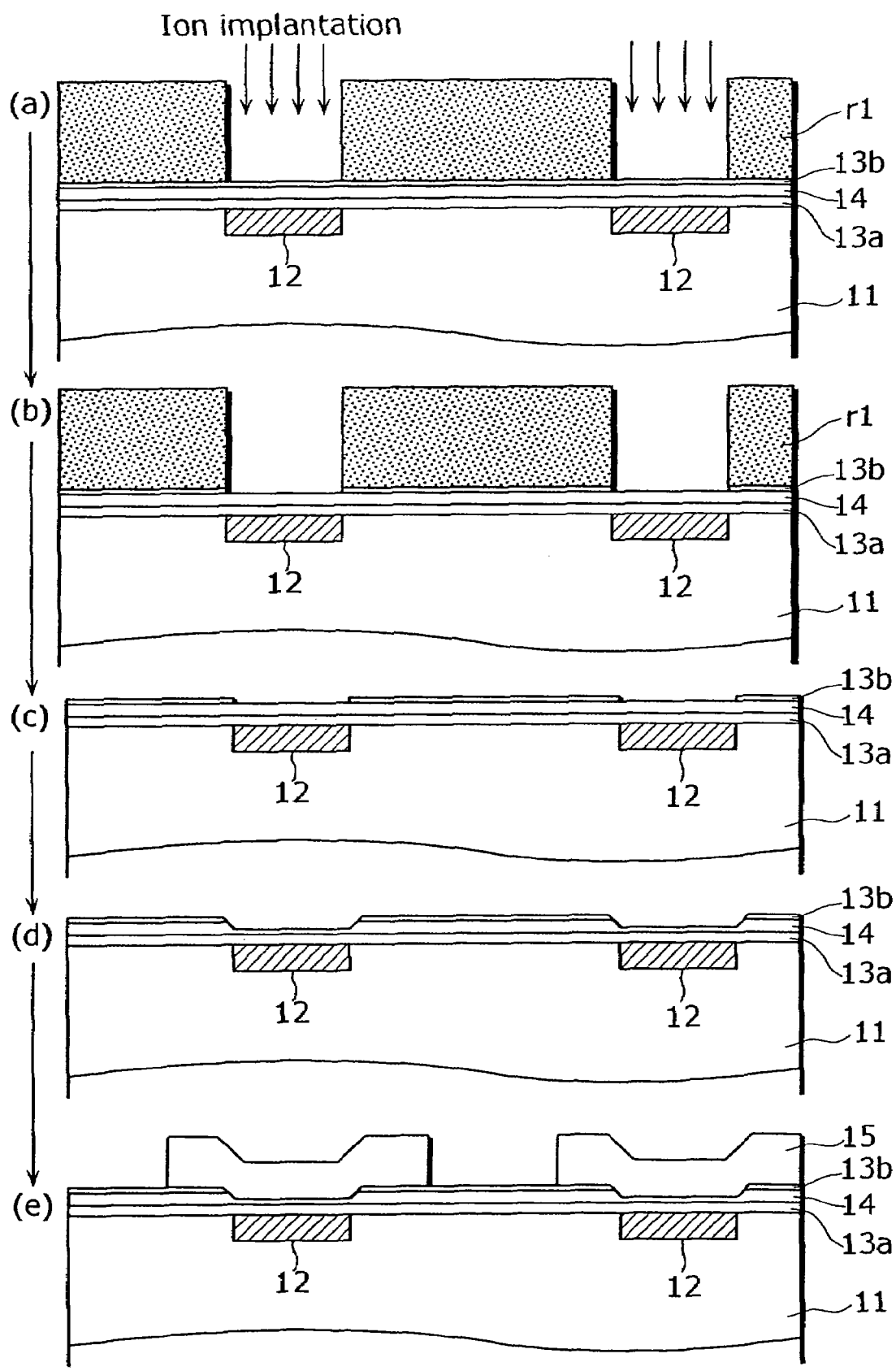
FIGS. 14(a)-14(e) are diagrams showing a second manufacturing method of the semiconductor device in the third embodiment.

(71) As shown in FIG. 14(a), the silicon oxide film 13a (with the thickness of 20 to 40 nm), the silicon nitride film 14 (with the thickness of 30 to 50 nm) and the silicon oxide film 13b (with the thickness of 10 nm or less) are formed on the silicon semiconductor substrate 11. Next, the resist pattern r1 is formed on the silicon oxide film 13b. Furthermore, the transfer channel 12 is formed by ion implantation.

(72) As shown in FIG. 14(b), the resist pattern r1 is left in place, while removing the silicon oxide film 13b above the transfer channel 12 by etching using hydrofluoric acid or the like. As a result, the part of the silicon oxide film not masked with the resist pattern r1 is removed.

(73) As shown in FIG. 14(c), the resist pattern r1 is removed. As shown in FIG. 14(d), by use of the silicon oxide film 13b as a mask, the silicon nitride film 14 is half-etched using phosphoric acid or the like. As a result, the insulating film including the silicon oxide and nitride films has the first thickness part and the second thickness part.

(74) As shown in FIG. 14(e), the transfer electrode 15 is formed.

(75) After that, as shown in FIG. 12, the protective film 16 and the light shielding film 18 are formed. The semiconductor device as shown in FIG. 12, with the very thin silicon oxide film 13b being remained, is manufactured in the above-mentioned process.

Third Manufacturing Method

Figure 15:
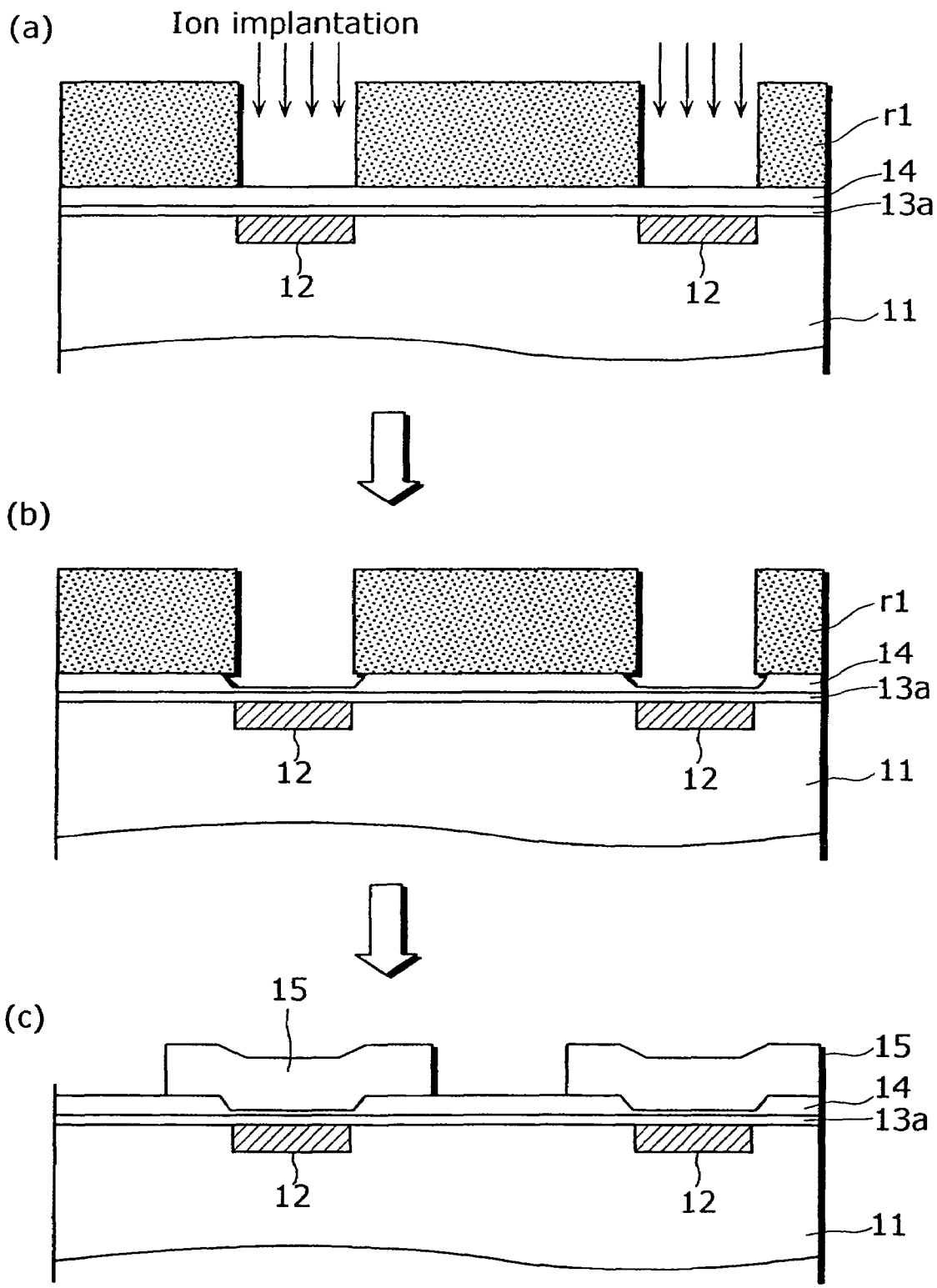
FIGS. 15(a)-15(c) are diagrams showing a third manufacturing method of the semiconductor device in the third embodiment.

FIGS. 15(a) to 15(c) are diagrams illustrating, in manufacturing process sequence of the third manufacturing method, cross sections of the semiconductor device in the third embodiment. Such manufacturing process shall be explained in (81) to (84) below.

(81) As shown in FIG. 15(a), the silicon oxide film 13a, the silicon nitride film 14 and the transfer channel 12 are formed. This process is same as the above (61).

(82) As shown in FIG. 15(b), the resist pattern r1 is left in place, while reducing, by half-etching, the thickness of the silicon nitride film above the transfer channel 12. As a result, the two-layer insulating film has the first thickness part and the second thickness part. In this etching, the mask pattern for forming the transfer channel 12 is used as the resist pattern r1, so the silicon nitride film only above the transfer channel 12 can be removed with pinpoint accuracy.

(83) As shown in FIG. 15(c), after removing the resist pattern r1, the transfer electrode 15 is formed.

(84) After that, as shown in FIG. 12, the protective film 16 and the light shielding film 18 are formed. The semiconductor device as shown in FIG. 12 is manufactured in the above-mentioned process.

As described above, according to the semiconductor device in the present embodiment, the second thickness part of the two-layer insulating film which is made up of the silicon oxide film and the silicon nitride film is formed by reducing the thickness of the silicon nitride film. As a result, it becomes possible to form the insulating film having the first thickness part and the second thickness part without generating birds' beaks on the silicon oxide film because there is no process of re-oxidization.

In the semiconductor device as shown in FIG. 12, the width of the second thickness part is same as the width W1 of the transfer channel 12, but it may be the width W2 that is wider than the width W1 of the transfer channel 12 and narrower than the width W3 of the transfer electrode 15.

In each of the above embodiments, the transfer channel 12 and the transfer electrode 15 are included in a vertical CCD, but the present invention can also be applied to the transfer channel and the transfer electrode included in a horizontal CCD.

The semiconductor device in each of the above embodiments is incorporated, as a CCD solid-state image sensor, into a camera or the like.

Although the present invention has been fully described by way of examples with reference to the accompanying drawings, it is to be noted that various changes and modifications will be apparent to those skilled in the art. Therefore, unless such changes and modifications otherwise depart from the scope of the present invention, they should be construed as being included therein.

INDUSTRIAL APPLICABILITY

The present invention is suitable for a semiconductor device including a plurality of photodiodes and transfer channels which are formed in a semiconductor substrate, a manufacturing method thereof, and a camera equipped with the semiconductor device. For example, the present invention is suitable for a CCD image sensor, a digital still camera, a camera incorporated in a mobile phone, a camera incorporated in a notebook computer, a camera unit to be connected to an information processor, or the like.

What is claimed is:

1. A solid-state image sensor comprising:
   a semiconductor substrate having a photoelectric conversion region;
   an insulating film formed on said semiconductor substrate;
   an electrode formed on said insulating film, said electrode for reading signal charge from said photoelectric conversion region by applying voltage via said insulating film; and
   a light shielding film located over said electrode and a part of said photoelectric conversion region, wherein
   a part of said insulating film located above said photoelectric conversion region has a first thickness,
   a part of said insulating film located below said electrode has a second thickness,
   the part of said insulating film having the first thickness includes at least a silicon oxide film and a second insulating film located on the silicon oxide film, and
   a thickness of the second insulating film is greater than a thickness of the silicon oxide film.

2. The solid-state image sensor according to claim 1, wherein a part of said electrode is located over a part of said photoelectric conversion region.

3. The solid-state image sensor according to claim 1, wherein said silicon oxide film does not form a Bird's Beak.

4. The solid-state image sensor according to claim 1, wherein the part of said insulating film having the second thickness is made of silicon oxide and silicon nitride.

5. The solid-state image sensor according to claim 1, wherein the second insulating film is a silicon nitride film.

6. A camera comprising a solid-state image sensor, wherein said solid-state image sensor includes:
   a semiconductor substrate having a photoelectric conversion region;
   an insulating film formed on said semiconductor substrate;
   an electrode formed on said insulating film, said electrode for reading signal charge from said photoelectric conversion region by applying voltage via said insulating film; and
   a light shielding film located over said electrode and a part of said photoelectric conversion region, and wherein
a part of said insulating film located above said photoelectric conversion region has a first thickness,
a part of said insulating film located below said electrode has a second thickness,
the part of said insulating film having the first thickness includes at least a silicon oxide film and a second insulating film located on the silicon oxide film, and
a thickness of the second insulating film is greater than a thickness of the silicon oxide film.

7. The camera according to claim 6, wherein a part of said electrode is located over a part of said photoelectric conversion region.

8. The camera according to claim 6, wherein said silicon oxide film does not form a Bird's Beak.

9. The camera according to claim 6, wherein the part of said insulating film having the second thickness is made of silicon oxide and silicon nitride.

10. The camera according to claim 6, wherein the second insulating film is a silicon nitride film.

* * * * *